(12) United States Patent
Hsu et al.

(10) Patent No.: US 9,960,753 B2
(45) Date of Patent: May 1, 2018

(54) APPARATUS AND METHOD FOR LOW POWER FULLY-INTERRUPTIBLE LATCHES AND MASTER-SLAVE FLIP-FLOPS

(71) Applicant: Intel Corporation, Santa Clara, CA (US)

(72) Inventors: Steven K. Hsu, Lake Oswego, OR (US); Amit Agarwal, Hillsboro, OR (US); Ram K. Krishnamurthy, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days. days.

(21) Appl. No.: 15/209,531

(22) Filed: Jul. 13, 2016

(65) Prior Publication Data

US 2016/0322962 A1    Nov. 3, 2016

Related U.S. Application Data

(60) Continuation of application No. 14/711,686, filed on May 13, 2015, now Pat. No. 9,397,641, which is a division of application No. 14/069,198, filed on Oct. 31, 2013, now Pat. No. 9,035,686.

(51) Int. Cl.
*H03K 3/289* (2006.01)
*H03K 3/3562* (2006.01)
*H03K 3/356* (2006.01)

(52) U.S. Cl.
CPC ... *H03K 3/35625* (2013.01); *H03K 3/356104* (2013.01)

(58) Field of Classification Search
CPC .................................................. H03K 3/35625
See application file for complete search history.

(56) References Cited

U.S. PATENT DOCUMENTS

| 6,597,623 B2 | 7/2003 | Krishnamurthy et al. |
| 6,690,604 B2 | 2/2004 | Hsu et al. |
| 7,016,239 B2 | 3/2006 | Chatterjee et al. |

(Continued)

FOREIGN PATENT DOCUMENTS

WO    2013074073 A1    5/2013

OTHER PUBLICATIONS

Fischer, Tim, et al., "Design solutions for the Bulldozer 32nm SOI 2-core processor module in an 8-core CPU," IEEE ISSCC Digest Technical Papers, Feb. 2011. pp. 78-80.

(Continued)

*Primary Examiner* — Daniel Puentes
(74) *Attorney, Agent, or Firm* — Compass IP Law PC

(57) ABSTRACT

Described is a latch which comprises: a first AND-OR-invert (AOI) logic gate; and a second AOI logic gate coupled to the first AOI logic gate, wherein the first and second AOI logic gates have respective first and second keeper devices coupled to a power supply node. Described is a flip-flop which comprises: a first latch including: a first AOI logic gate; and a second AOI logic gate coupled to the first AOI logic gate, wherein the first and second AOI logic gates have respective first and second keeper devices coupled to a power supply, the first latch having an output node; and a second latch having an input node coupled to the output node of the first latch, the second latch having an output node to provide an output of the flip-flop.

13 Claims, 14 Drawing Sheets

(56) References Cited

U.S. PATENT DOCUMENTS

| | | |
|---|---|---|
| 7,057,913 B2 | 6/2006 | Hsu et al. |
| 7,265,599 B1 * | 9/2007 | Pasqualini ............. H03K 3/013 327/202 |
| 7,362,621 B2 | 4/2008 | Chatterjee et al. |
| 7,606,062 B2 | 10/2009 | Hsu et al. |
| 7,800,407 B1 | 9/2010 | Agarwal et al. |
| 7,855,575 B1 | 12/2010 | Hsu et al. |
| 9,397,641 B2 * | 7/2016 | Hsu ................. H03K 3/356104 |
| 2009/0168557 A1 | 7/2009 | Agarwal et al. |
| 2014/0225657 A1 | 8/2014 | Maeno |

OTHER PUBLICATIONS

Stackhouse, Blaine, et al., "A 65 nm 2-billion transistor quad-core Itanium processor," IEEE Journal of Solid-State Circuits, 44.1, pp. 18-31.

Stojanovic, Vladimir, et al., "Comparative analysis of master-slave latches and flip-flops for high-performance and low-power systems," IEEE Journal of Solid-State Circuits, 34.4, pp. 536-548.

Tschanz, James, et al., "Comparative delay and energy of single edge-triggered and dual edge-triggered pulsed flip-flops for high-performance microprocessors," IEEE ISLPED, Aug. 2001, pp. 147-152.

Weste, N., et al., "Principles of CMOS VLSI Design, A Systems Perspective", Second Edition, p. 329, 1994.

\* cited by examiner

APPARATUS AND METHOD FOR LOW POWER FULLY-INTERRUPTIBLE LATCHES AND MASTER-SLAVE FLIP-FLOPS

RELATED CASES

The present application is a continuation of and claims the benefit of U.S. patent application Ser. No. 14/711,686, filed on May 13, 2015 and entitled "APPARATUS AND METHOD FOR LOW POWER FULLY-INTERRUPTIBLE LATCHES AND MASTER-SLAVE FLIP-FLOPS", which is a divisional of and further claims the benefit of U.S. patent application Ser. No. 14/069,198, filed on Oct. 31, 2013 entitled "APPARATUS AND METHOD FOR LOW POWER FULLY-INTERRUPTIBLE LATCHES AND MASTER-SLAVE FLIP-FLOPS" now issued as U.S. Pat. No. 9,035,686, both of which are incorporated by reference in their entirety.

BACKGROUND

A primary design challenge for modern microprocessors, DSPs (digital signal processors), and SoCs (System-on-Chip) in smart phones, tablets, laptops, and servers, etc., is improving power efficiency or performance per Watt. In these clocked synchronous systems, a large percentage of the overall power dissipation is in the clock tree grid and final sequential load. Designing sequential units for low power consumption improve power efficiency of these clocked synchronous systems.

Another knob to reduce power and improve power efficiency in such a system is to lower the supply voltage and scale down frequency. Voltage scaling of a chip may be constrained by the lowest operating voltage ($V_{MIN}$) under process variation. One of the limiters of $V_{MIN}$ is the sequential hold time degradation at lower voltages resulting in frequency independent functional failures. Since the majority of sequential units have a very low data activity (e.g., 5-10%), clock power dominates the overall sequential dynamic power.

A large percentage of logic paths in a system may have timing slack or are non-critical. Since delay may not be the primary concern, these non-critical paths typically use sequential units with minimum sized transistors to reduce power. These minimum sized sequential units are a common power lever used in many microprocessor and SoC products. These sequential units cannot be downsized any further to take advantage of the timing slack because the sizing of the sequential units depends on the minimum sized transistors allowed by the process technology and that a minimum transistor width is needed to meet the product's $V_{MIN}$ requirements.

One way to reduce power consumption in sequential units is to use pulsed latches. However, pulsed latches degrade hold time and may also suffer pulse width evaporation issues. Another way to reduce power consumption in sequential units is to use auto-gated flip-flops based on data probability. However, for minimum sized flip-flops, power benefit may not be realized for auto-gated flip-flops since the additional gating circuitry consumes more power than saved.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
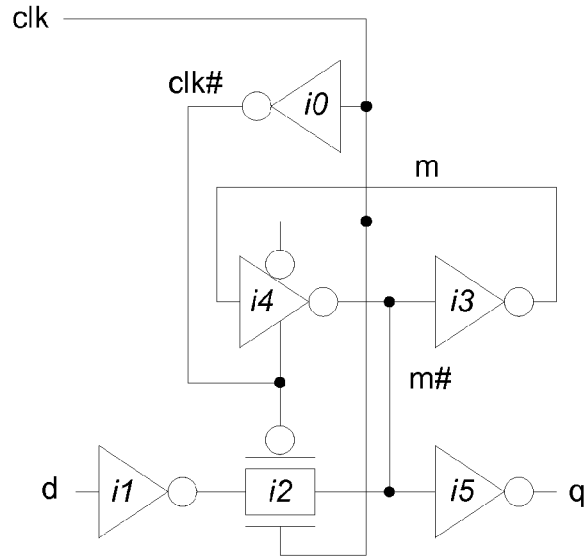
FIG. 1A illustrates a conventional N-first transmission gate protected input latch.
Figure 1B:
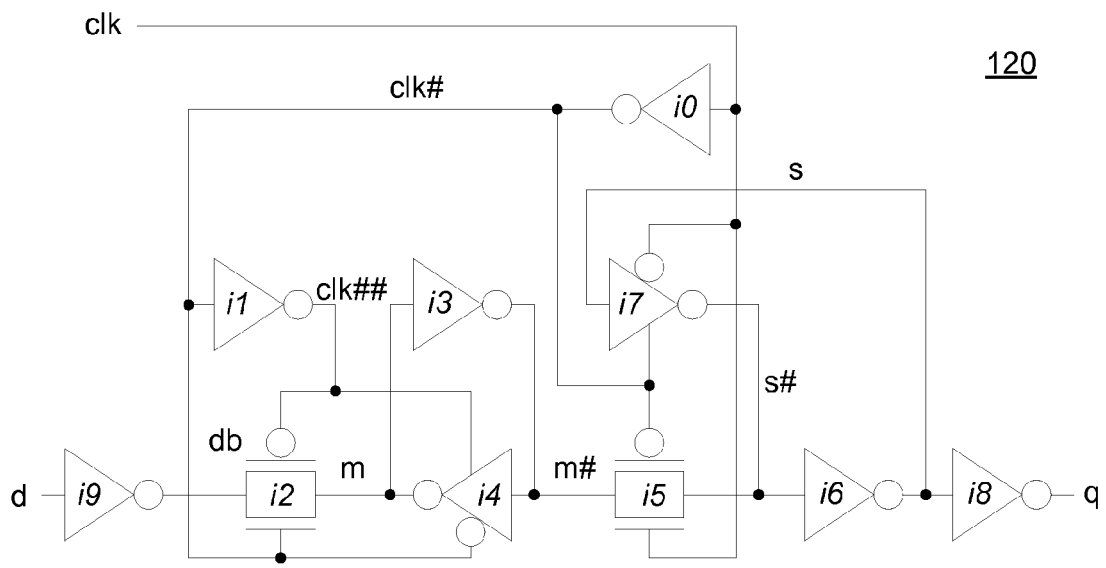
FIG. 1B illustrates a conventional N-first transmission gate protected input master-slave flip-flop (FF).

Latches and flip-flops are essential building blocks of any synchronous digital system. FIG. 1A illustrates a conventional N-first transmission gate (TG) protected input latch 100. FIG. 1B illustrates a conventional N-first TG protected input master-slave flip-flop (FF) 120.

Latch 100 consists of inverters i0, i1, i3, and i5, tri-state inverter i4, and TG i2. Inverter i1 receives input data 'd' while inverter i0 receives clock "clk." Inverter i4 is a gated device i.e., controllable by "clk" and "clk#" signals, where "clk#" signal is inverse of "clk" signal. When clk is low, inverter i4 acts like an inverter, but when clk high, the output of inverter i4 is tri-stated (i.e., high impedance). Here, signal name and corresponding node name are interchangeably used. For example, depending on the context of the sentence, "clk" may be used to describe "clk" signal or "clk" node. Inverter i5 provides the output 'q.' Nodes 'm' and "m#" are internal nodes.

FF 120 is a master-slave FF formed from latch 100. Here, FF 120 consists of inverters i0, i1, i3, i6, i8, and i9; tri-state inverters i4 and i7, and TGs i2 and i5, where tri-state inverters i7 and i4 are gated devices controllable by "clk" (or "clk##") and "clk#" signals, and where "clk##" is inverse of "clk#" signal. Nodes, "clk#," "clk##," "db," 'm,' "m#," 's,' and "s#" are internal nodes. Latch 100 and FF 120 are well known in the art and so their basic operation and structure are not discussed in detail.

Latch 100 is transparent during the high phase of "clk" signal and is classified as N-first latch. The total number of transistors for latch 100 is 14, out of which 6 are dedicated to the clock path, contributing to the overall clock power. Latch 100 may provide good low voltage robustness and tolerance to process variation due to fully interruptible keeper i4. The cost of fully interruptible keeper is an increased clock load by at least two transistors to enable good low voltage operation. Latch 100 requires the inversion of "clk" signal to produce "clk#" signal. The local clock inverter generating this signal (i.e., "clk#") is typically sized with minimum widths to reduce power and is susceptible to random variations, impacting the hold time at low voltages.

FF 120 is a single-ended TG based flip-flop. To allow for low voltage scalability, the keeper circuit (i.e., inverter i7) is fully-interruptible and requires clock inversion. As discussed above with reference to latch 100, the keeper circuit increases the number of clock transistors, clock load, and power. For example, conventional latch 100 requires at least six clock transistors, while conventional master-slave FF 120 requires twelve clock transistors.

Figure 2A:
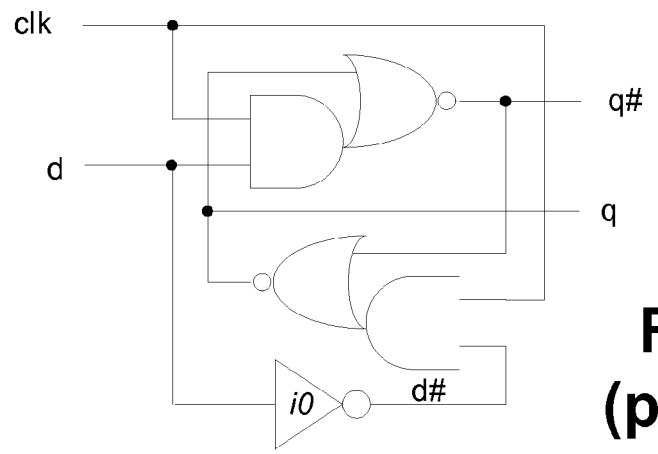
FIG. 2A illustrates a conventional logical representation of an N-first AND-OR-Invert (AOI) high-phase latch.

FIG. 2A illustrates a conventional logical representation of an N-first AND-OR-Invert (AOI) high-phase latch 200. AOI latch 200 consists of two back-to-back coupled AOI logic gates and an inverter i0. Here, 'q' and "q#" are outputs (i.e., output and inverse of output), 'd' is data ("d#" is inverse of 'd'), and clk is clock. The derivation of an AOI latch 200 begins with a fundamental SR (set-reset) NOR latch structure. The cross-coupled NOR latch follows a text book truth table. Next, the SR NOR latch inputs are gated with the clock which results in a circuit structure that is functionally equivalent to a conventional TG or tri-state latch.

However, a gated SR NOR latch increases transistor count and clock power compared to conventional latch. Further optimization of the gated SR NOR latch is achieved by combining the gating logic with the cross-coupled latch stage forming a single complex static CMOS gate. The two cross-coupled static complex CMOS gates form an AOI latch. A local data inverter i0 is also added to remove the invalid condition, (when set and reset are logically high) and also enables a single-rail input to minimize input routing. Each AOI logic gate consists of an AND gate with its output being fed to a NOR gate (i.e., logically an OR gate followed by an inverter).

AOI latch 200 eliminates the local clock inverter reducing the total number of clock devices from six to four. This reduction in clock transistors lowers the clock power, however, AOI latch 200 $d$-$q$ (data to output) delay is slower than conventional latches (e.g., latch 100). The clock pin fan-in transistor count remains four, like in conventional latch 100. A P-first latch, or a latch which is transparent during the low phase, is implemented by using OAI (OR-AND-Invert) gates instead of AOI logic gates.

Figure 2B:
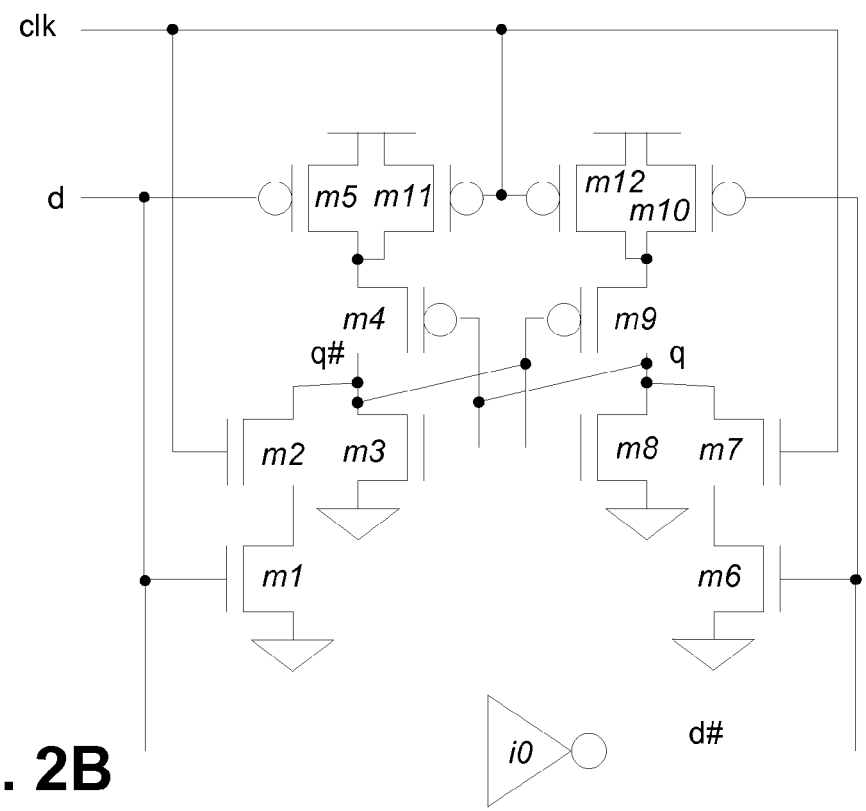
FIG. 2B illustrates a conventional circuit representation of the N-first AOI high-phase latch.

FIG. 2B illustrates a conventional circuit 220 representation of the N-first AOI high-phase latch 200. Circuit 220 comprises p-type devices m4, m5, m9, m10, m11, and m12, and n-type devices m1, m2, m3, m6, m7, and m8; and inverter i0. Transistors m1, m2, m3, m4, m5 and m11 form a first AOI logic gate, while transistors m6, m7, m8, m9, m10, and m12 form a second AOI logic gate. Here, nodes "d#," "q#," and 'q' form the internal nodes. Circuit 220 is well known and so its structure is not described in detail.

The embodiments describe fully-interruptible AOI latches and flip-flops for reducing power and improving $V_{MIN}$, resulting in power reduction (e.g., 45%) over traditional latches and FFs. Various embodiments of AOI based latches and flip-flops are described to improve power for minimum sized sequential units that may be used in non-critical paths with low data activity, removing min-delay buffers. The embodiments enable opportunistic power reduction, show excellent tolerance to process variation, and are applicable to any non-critical latch and flip-flop structures found in datapath, memories, and clock gating circuitry.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 3A:
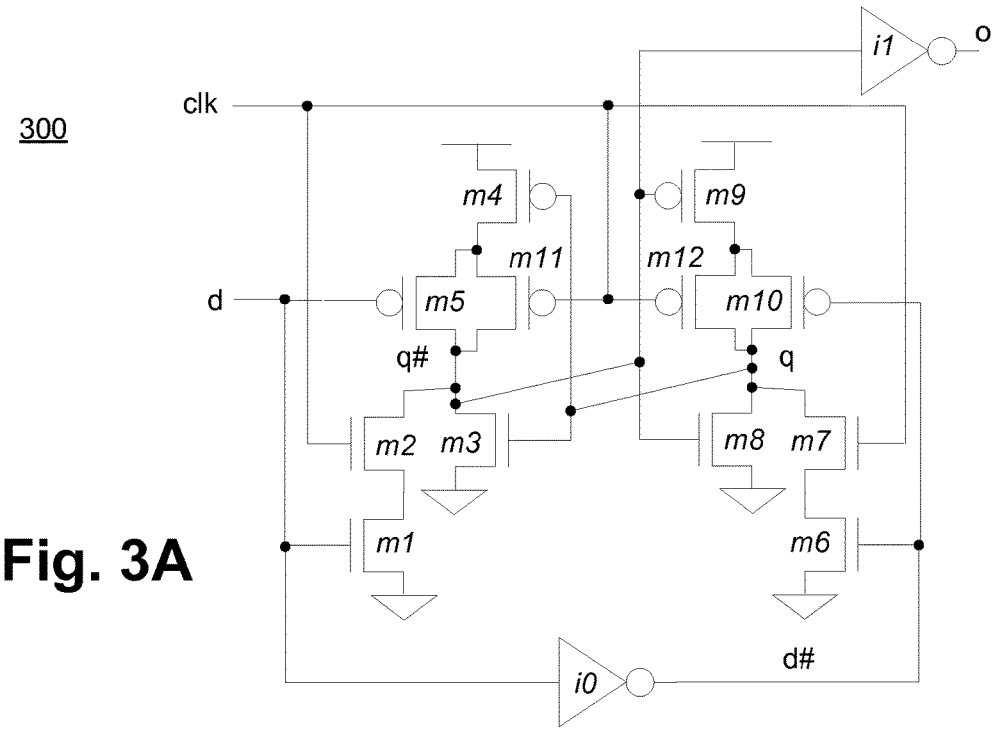
FIG. 3A illustrates an N-first AOI latch circuit with swapped keeper stack, according to one embodiment of the disclosure.

FIG. 3A illustrates an N-first AOI latch circuit 300 with swapped keeper stack, according to one embodiment of the disclosure. It is pointed out that those elements of FIG. 3A having the same reference numbers (or names) as the elements of any other figure can operate or function in any manner similar to that described, but are not limited to such. FIG. 3A is described with reference to FIG. 2B.

Due to high instance count of latches and FFs, sequential area is an important factor in minimizing overall die size and cost. To keep the same area size as that of latch 220 of FIG. 2B while reducing power consumption, keeper stack of the AOI latch 220 is swapped in latch 300. In one embodiment, m4 is swapped with m5 and m11, and m9 is swapped with m10 and m12.

In latch 220, for the first AOI logic gate, drain terminal of m4 is coupled to q#, source terminal of m4 is coupled to drain terminals of m5 and m11, while source terminal of m5 and m11 are coupled to Vcc (power supply). In latch 220, for the second AOI logic gate, drain terminal of m9 is coupled to 'q,' source terminal of m9 is coupled to drain terminals of m10 and m12, while source terminal of m10 and m12 are coupled to Vcc (power supply).

In the embodiment of latch 300, for the first AOI logic gate, source terminal of m4 is coupled to Vcc while drain terminal of m4 is coupled to source terminals of m5 and m11. In this embodiment, drain terminals of m5 and m11 are coupled to node "q#." In the embodiment of latch 300, for the second AOI logic gate, source terminal of m9 is coupled to Vcc while drain terminal of m9 is coupled to source terminals of m10 and 12. In this embodiment, drain terminals of m10 and m12 are coupled to node 'q.'

Latches 220 and 300 are functionally equivalent, but latch 300 allows a single continuous poly connection for all clock transistors and maximizes diffusion sharing, therefore minimizing layout area, according to one embodiment. In one embodiment, an inverting latch can be configured by connecting output inverter i1 to 'q' instead of "q#." The embodiment of FIG. 3A results in a double high layout topology as discussed with reference to FIG. 5A.

Figure 3B:
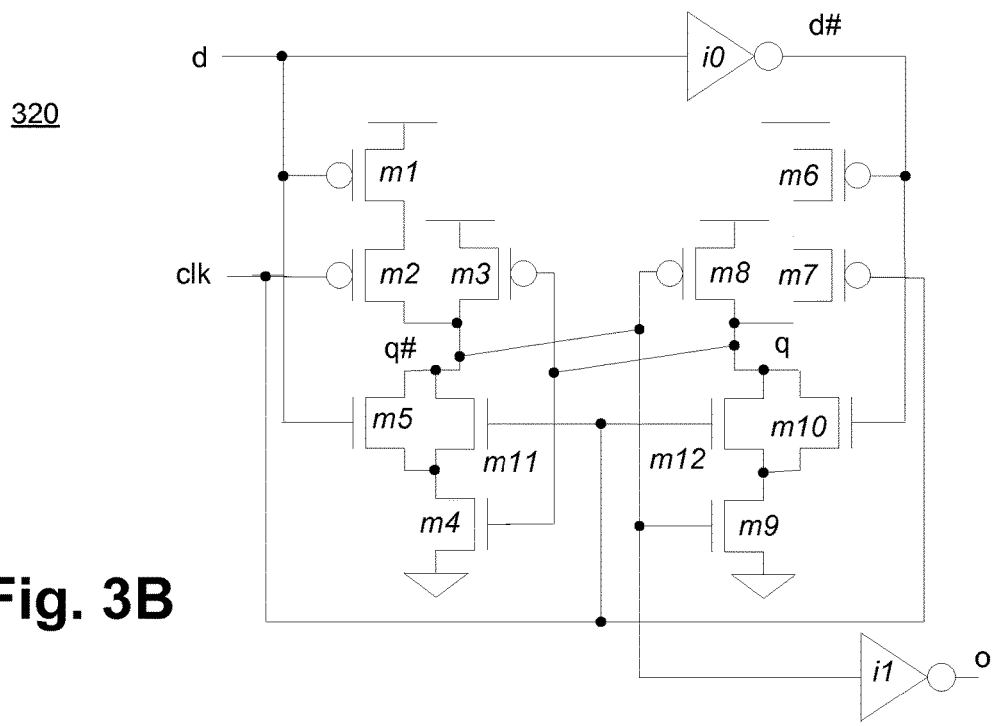
FIG. 3B illustrates a P-first OAI (OR-AND-Invert) latch circuit with swapped keeper stack, according to one embodiment of the disclosure.

FIG. 3B illustrates a P-first OAI (OR-AND-Invert) latch circuit 320 with swapped keeper stack, according to one embodiment of the disclosure. It is pointed out that those elements of FIG. 3B having the same reference numbers (or names) as the elements of any other figure can operate or function in any manner similar to that described, but are not limited to such. FIG. 3B is described with reference to FIG. 3A.

Traditional P-first OAI includes p-type transistors m1, m2, m3 and n-type transistors m5, m11, and m4 together forming a first OAI gate. Traditional P-first OAI includes p-type transistors m6, m7, m8 and n-type transistors m9, m10, and m12 together forming a second OAI gate. Traditional P-first AOI latch has m4 device with its drain terminal coupled to node "q#," and source terminal coupled to drain terminals of m5 and m11. Traditional P-first AOI latch has the source terminals of m5 and m11 coupled to ground. Traditional P-first AOI latch has m9 device with its drain terminal coupled to node 'q,' and source terminal coupled to drain terminals of m10 and m12. Traditional P-first AOI latch has the source terminals of m10 and m12 coupled to ground.

A traditional P-first AOI latch (not shown) is similar to latch 320, but with the following changes compared to the embodiment of latch 320. In the embodiment of latch 320, for the first AOI logic gate, source terminal of m4 is coupled to Vss (ground) while drain terminal of m4 is coupled to source terminals of m5 and 11. In this embodiment, drain terminals of m5 and m11 are coupled to node "q#." In the embodiment of latch 320, for the second AOI logic gate, source terminal of m9 is coupled to Vss (ground) while drain terminal of m9 is coupled to source terminals of m10 and 12. In this embodiment, drain terminals of m10 and m12 are coupled to node 'q.' In one embodiment, unlike traditional P-first OAI latch, latch 320 allows a single continuous poly connection for all clock transistors and maximizes diffusion sharing, therefore minimizing layout area, according to one embodiment. In one embodiment, an inverting latch can be configured by connecting output inverter i1 to 'q' instead of "q#."

Figure 4:
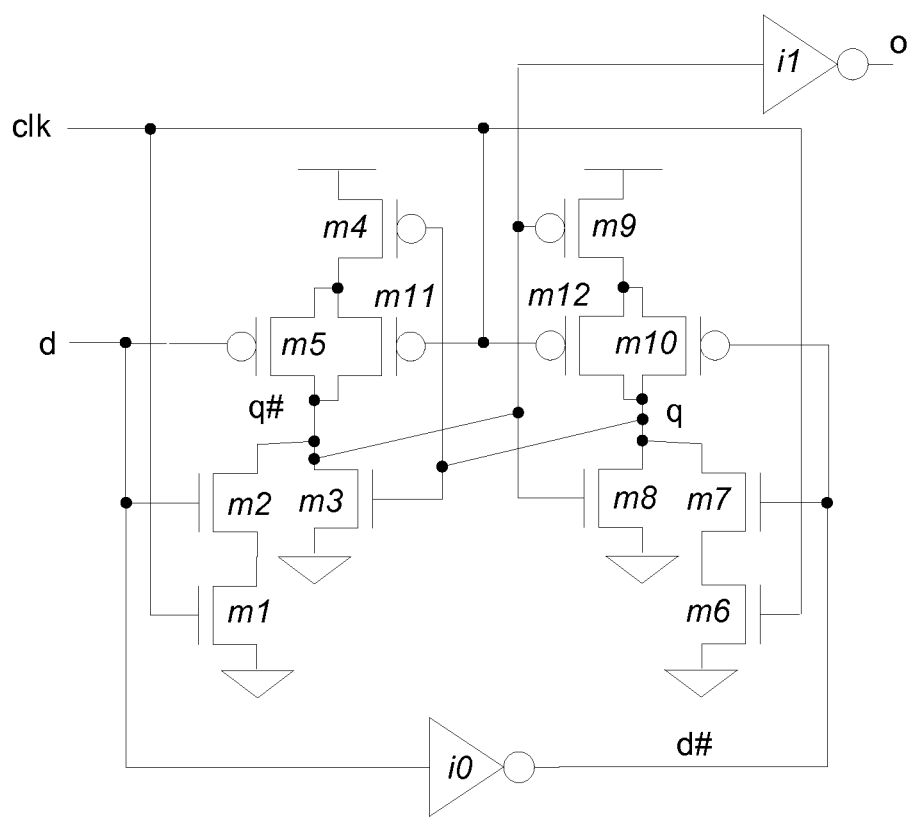
FIG. 4 illustrates an N-first AOI latch circuit with swapped keeper stack and data, according to one embodiment of the disclosure.

FIG. 4 illustrates an N-first AOI latch circuit 400 with swapped keeper stack and data, according to one embodiment of the disclosure. It is pointed out that those elements of FIG. 4 having the same reference numbers (or names) as the elements of any other figure can operate or function in any manner similar to that described, but are not limited to such. FIG. 4 is described with reference to FIG. 3A.

So as not to obscure the embodiment of FIG. 4, differences between FIG. 3A and FIG. 4 are discussed. In this embodiment, in addition to keeper swapping as discussed with reference to FIG. 3A, data coupling is also swapped compared to the data coupling in FIG. 3A. In the embodiment, of FIG. 3A, data 'd' is coupled to gate terminals of m2 and m5 while inverse of data (i.e., "d#") is coupled to gate terminals of m7 and m10. In this embodiment, data 'd' is coupled to gate terminals of m1 and m5 while inverse of data (i.e., "d#") is coupled to gate terminals of m6 and m10. The embodiment of FIG. 4 results in a single high layout topology as discussed with reference to FIG. 5B.

Figure 5A:
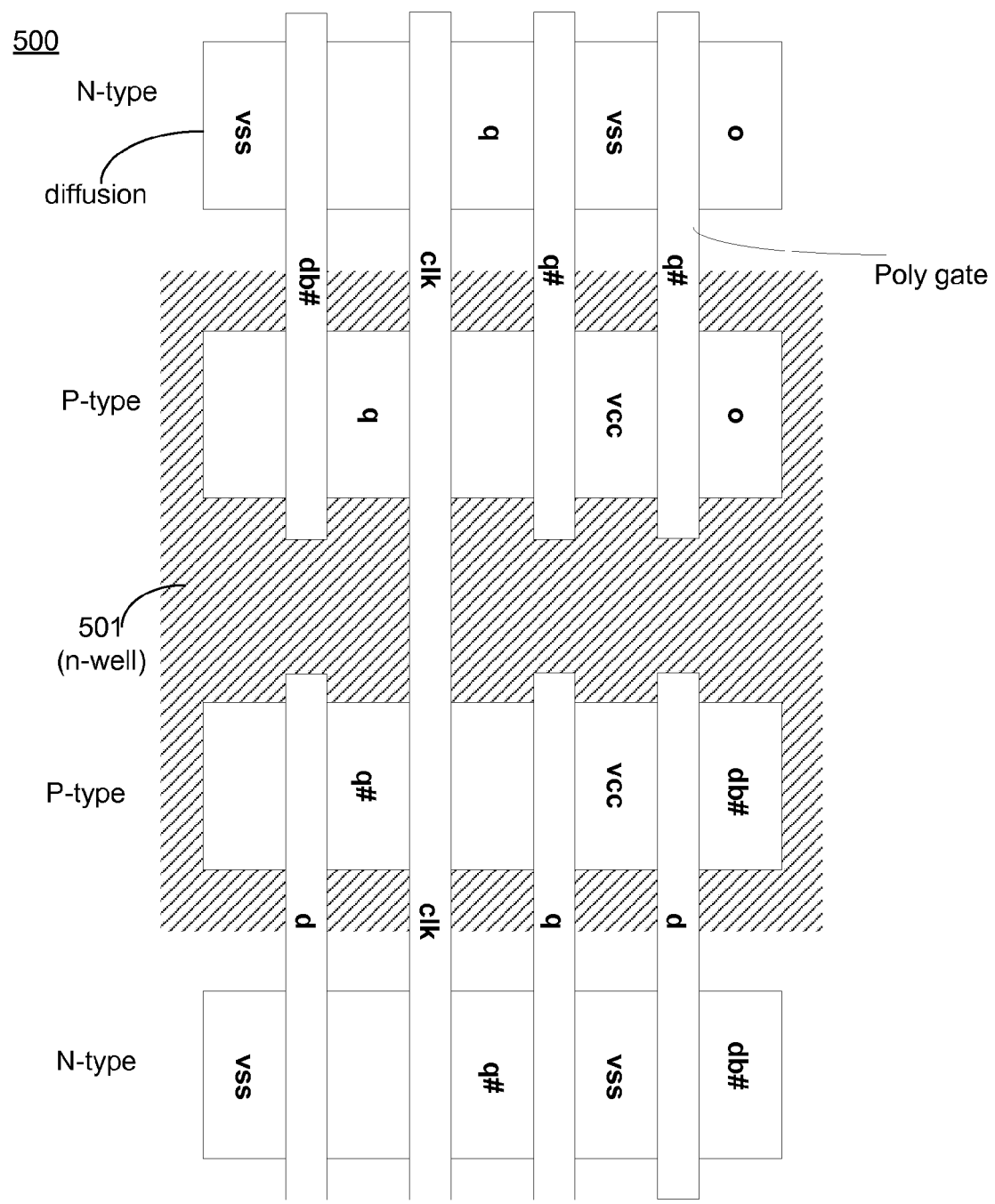
FIG. 5A illustrates layout of the N-first AOI latch circuit of FIG. 3A, according to one embodiment of the disclosure.

FIG. 5A illustrates layout 500 of the N-first AOI latch circuit of FIG. 3A, according to one embodiment of the disclosure. It is pointed out that those elements of FIG. 5A having the same reference numbers (or names) as the elements of any other figure can operate or function in any manner similar to that described, but are not limited to such. FIG. 5A is described with reference to FIG. 3A.

Layout 500 is a double high layout of latch 300, according to one embodiment. In this embodiment, layout 500 is four transistor polys wide. The central patterned area 501 is the n-well diffusion area which allows a single continuous poly connection for all clock transistors. The rectangle areas below the poly gates are diffusion areas. The labels on the poly gates indicate the gate terminals of the transistors, and the diffusion areas on either side of the poly gates are source and drain regions of the transistors.

In this embodiment, n-type transistors m1, m2, m3, and n-type transistor of inverter i1 are formed as the top n-type transistors (i.e., above the n-well 501 area). In one embodiment, n-type transistors m6, m7, m8, and n-type transistor of i0 are formed as the bottom n-type transistors (i.e., below the n-well 501 area). In this embodiment, p-type transistors m4, m5, m11, m9, m10, m12, and p-type transistors of inverters i0 and i1 are formed in the n-well region 501.

Figure 5B:
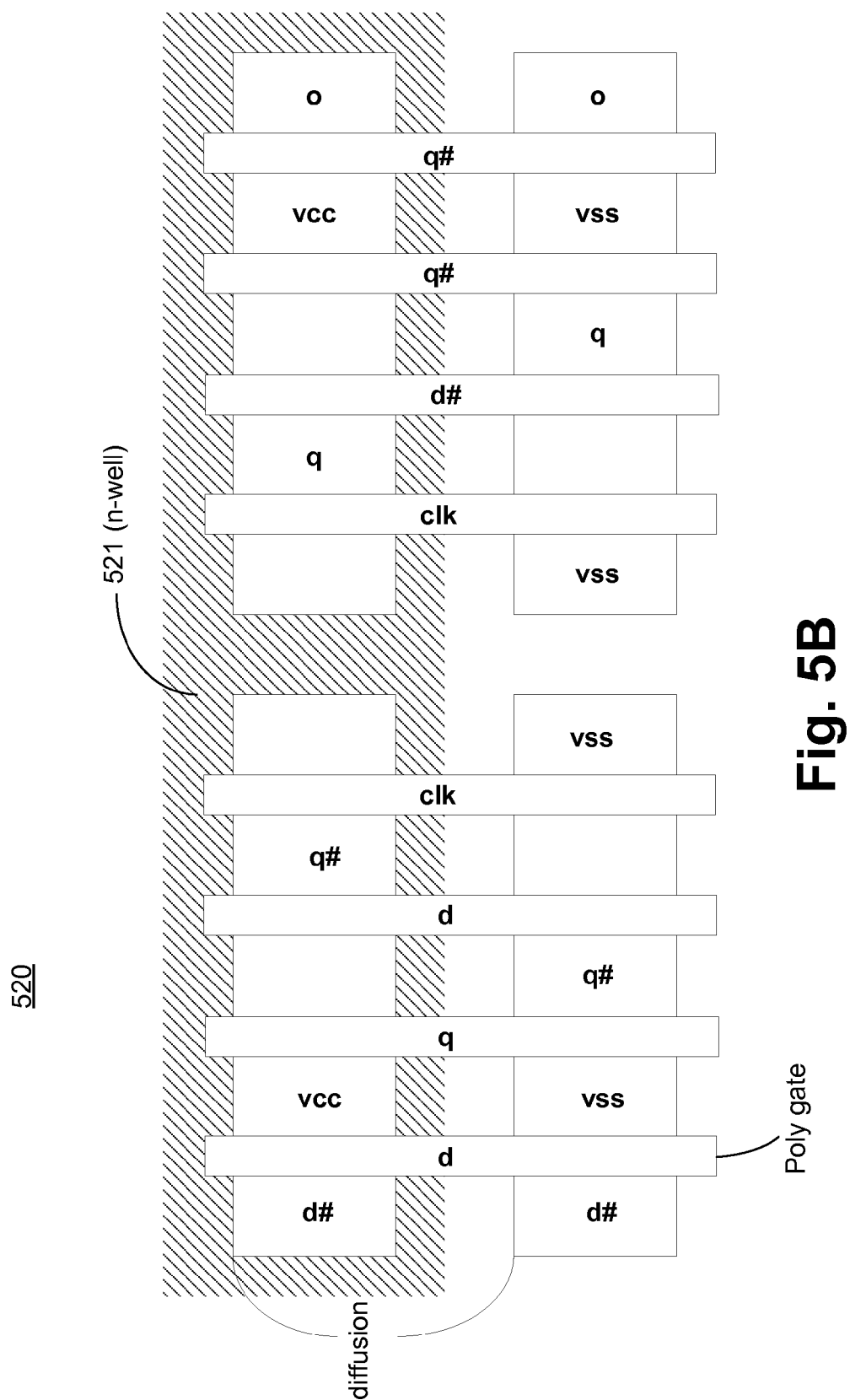
FIG. 5B illustrates layout of the N-first AOI latch circuit of FIG. 4, according to one embodiment of the disclosure.

FIG. 5B illustrates layout 520 of the N-first AOI latch circuit of FIG. 4, according to one embodiment of the disclosure. It is pointed out that those elements of FIG. 5B having the same reference numbers (or names) as the elements of any other figure can operate or function in any manner similar to that described, but are not limited to such. FIG. 5B is described with reference to FIG. 4.

Layout 520 is a single high layout of latch 400, according to one embodiment. In this embodiment, layout 520 is ten transistor polys wide. The patterned area 521 on the top is the n-well diffusion. The rectangle areas below the poly gates are diffusion areas. The labels on the poly gates indicate the gate terminals of the transistors, and the diffusion areas on either side of the poly gates are source and drain regions of the transistors.

In this embodiment, n-type transistors m1, m2, m3, and n-type transistor of inverter i1 are formed as the bottom left n-type transistors (i.e., below the n-well 521 area). In one embodiment, n-type transistors m6, m7, m8, and n-type transistor of i0 are formed as the bottom right n-type transistors (i.e., below the n-well 521 area). In this embodiment, p-type transistors m4, m5, m11, m9, m10, m12, and p-type transistors of inverters i0 and i1 are formed in the n-well region 521.

Between the layouts 500 and 520, for the same layout footprint (i.e., length and width) of layouts of traditional AOI latches, power is saved over traditional AOI based latches. In one embodiment, layout 500 and 520 is smaller in area than the layout area of transitional AOI latches.

Figure 6A:
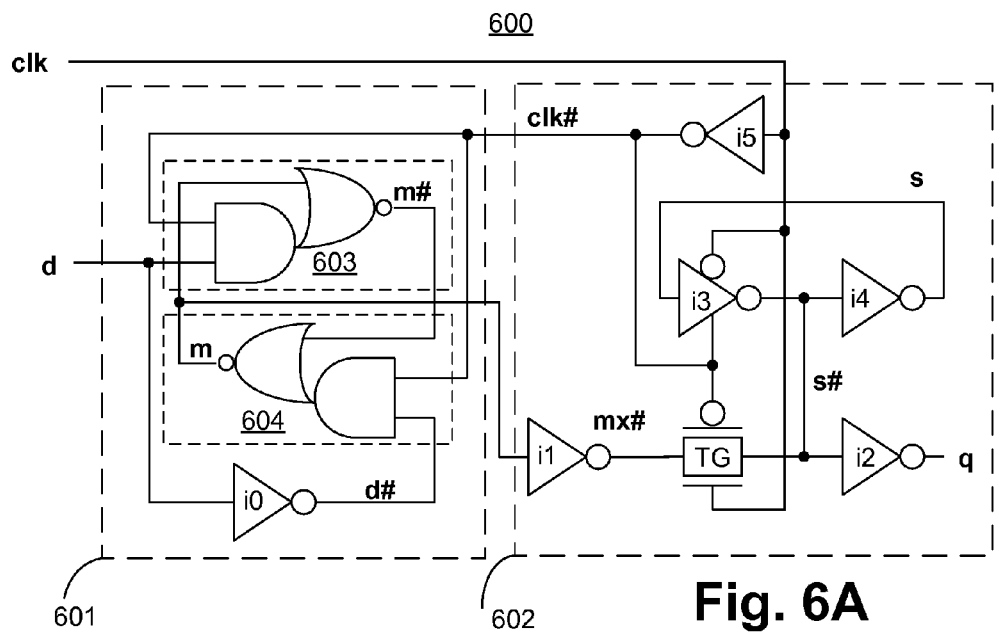
FIG. 6A illustrates a hybrid N-first AOI based rising edge FF, according to one embodiment of the disclosure.

FIG. 6A illustrates a hybrid N-first AOI based rising edge FF 600, according to one embodiment of the disclosure. It is pointed out that those elements of FIG. 6A having the same reference numbers (or names) as the elements of any other figure can operate or function in any manner similar to that described, but are not limited to such.

In one embodiment, FF 600 comprises a master stage 601 and slave stage 602. FF 600 functionally operates like any other traditional FF, but consumes lesser power. In this embodiment of FF 600, master stage of conventional flip-flop 120 is replaced with an N-first AOI latch (e.g., latches 300, 400, or any other AOI latch of the embodiments). For example, master stage 601 includes first AOI logic gate 603 and second AOI logic gate 604 cross-coupled to each other. Here, node "m#" is the same as node "q#" in embodiments of AOI latches 300 and 400.

In one embodiment, slave stage 602 is structurally the same as slave stage of conventional FF 120 of FIG. 1B. The embodiment of FF 600 is referred to a hybrid FF because one of the master or slave stages is an AOI based latch while one of the master or slave stages is a traditional latch. In this embodiment, slave stage 602 comprises inverter it (which is the same as the output inverter of AOI latch 300 or 400, for example), TG, gated inverter i3, output inverter i2, and cross-coupled inverter i4. Nodes "mx#" (where "mx#" signal is inverse of 'm' signal), "s#" (where "s#" is inverse of 's' signal), and 's' are internal nodes of slave stage 602. Inverter i5 is the clock inverter which receives clock signal "clk" and generates "clk#" signal, where "clk#" is inverse of "clk" signal.

Compared to FF 120, hybrid flip-flop 600 may increase the setup time, but improves the hold time while maintaining the same clk-to-q delay. In one embodiment, clock fan-in transistor count remains four, like the conventional design of FIG. 1B. In one embodiment, clock transistor count is reduced to 10 from 12 compared to a conventional design of FIG. 1B. Since clock path consumes the most dynamic power, reducing clock transistor count reduces overall power consumption of FF 600. While the embodiment of FF 600 illustrates master stage 601 implemented as an N-type AOI latch, in one embodiment, master stage 601 is implemented as a traditional latch while slave stage 602 is implemented as a P-type OAI latch.

Figure 6B:
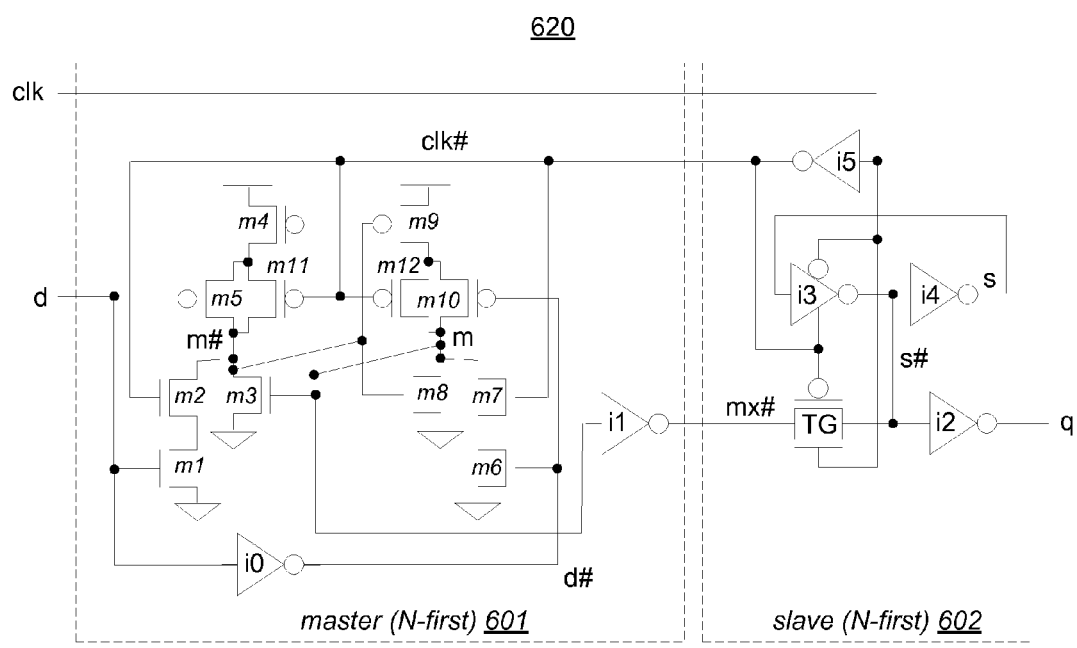
FIG. 6B illustrates circuit level implementation of FIG. 6A, according to one embodiment of the disclosure.

FIG. 6B illustrates circuit level implementation 620 of FIG. 6A, according to one embodiment of the disclosure. It is pointed out that those elements of FIG. 6B having the same reference numbers (or names) as the elements of any other figure can operate or function in any manner similar to that described, but are not limited to such.

In one embodiment, circuit 620 comprises master stage 601 which is the same as N-first AOI latch 300. In one embodiment, other N-first AOI latches discussed here can be used for master stage 601. In one embodiment, for a falling edge triggered FF, a P-first OAI latch (e.g., latch 320) may be used for master stage 601 and a traditional P-first TG latch (not shown) may be used for slave stage 602.

Figure 7A:
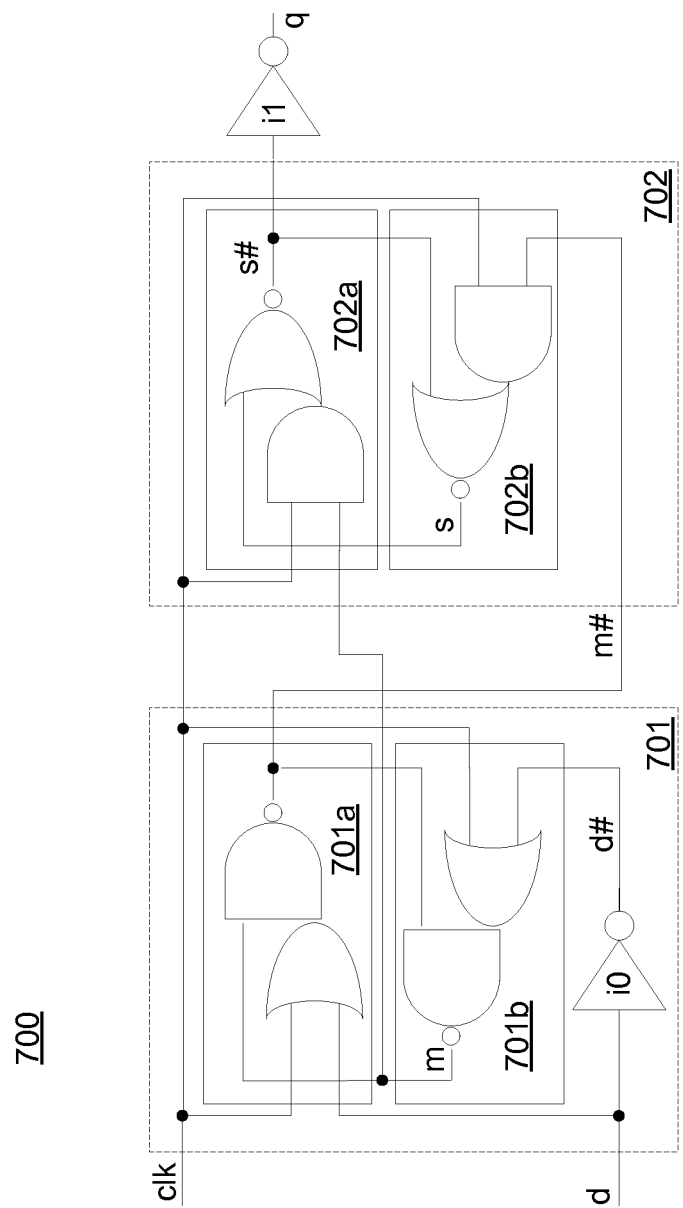
FIG. 7A illustrates a combo N-first AOI and P-first OAI based rising edge FF, according to one embodiment of the disclosure.

FIG. 7A illustrates a combo N-first AOI and P-first OAI based rising edge FF 700 where at least one of N-first AOI or P-first OAI have swapped keeper stack, according to one embodiment of the disclosure. It is pointed out that those elements of FIG. 7A having the same reference numbers (or names) as the elements of any other figure can operate or function in any manner similar to that described, but are not limited to such.

In one embodiment, FF 700 comprises N-first AOI latch 701, P-first OAI latch 702 and output inverter i1. In one embodiment, N-first AOI latch 701 includes a first AOI logic gate 701a and a second AOI logic gate 701b. In one embodiment, P-first OAI latch 702 includes a first OAI gate 702a and a second OAI gate 702b. In one embodiment, output inverter i1 is part of P-first OAI latch 702. In one embodiment, N-first AOI latch 701 is any of the N-first AOI latches discussed here.

For example, N-first AOI latch 701 is the same as N-first AOI latch 300 of FIG. 3A, N-first AOI latch 400 of FIG. 4, etc. Here, node "m#" corresponds to node "q#" of N-first AOI 300 and node 'm' corresponds to node 'q' of N-first AOI latch 300. Referring back to FIG. 7A, in one embodiment, P-first OAI latch 702 is the same as P-first OAI latch 320 of FIG. 3B. Here, node 's' corresponds to node "q#" of P-first OAI 320 and node "s#" corresponds to node 'q' of P-first OAI 320.

In one embodiment, for a rising edge-triggered flip-flop, master stage 701 is replaced by a P-first OAI latch (e.g., latch 320 of FIG. 3B) and slave stage 702 is replaced by an N-first AOI latch (e.g., latch 300 of FIG. 3A, or any other N-first AOI latch discussed here). In such an embodiment, local clock inverters may be eliminated, resulting in a true-single-phase clocked flip-flop. The embodiment of FF 700 reduces the clock transistor count further from twelve to eight, compared to a conventional TG design (e.g., FF 120 of FIG. 1B). In one embodiment, FF 700 increases both setup time and clk-q (clock to output) delay, but improves the hold time.

Figure 7B:
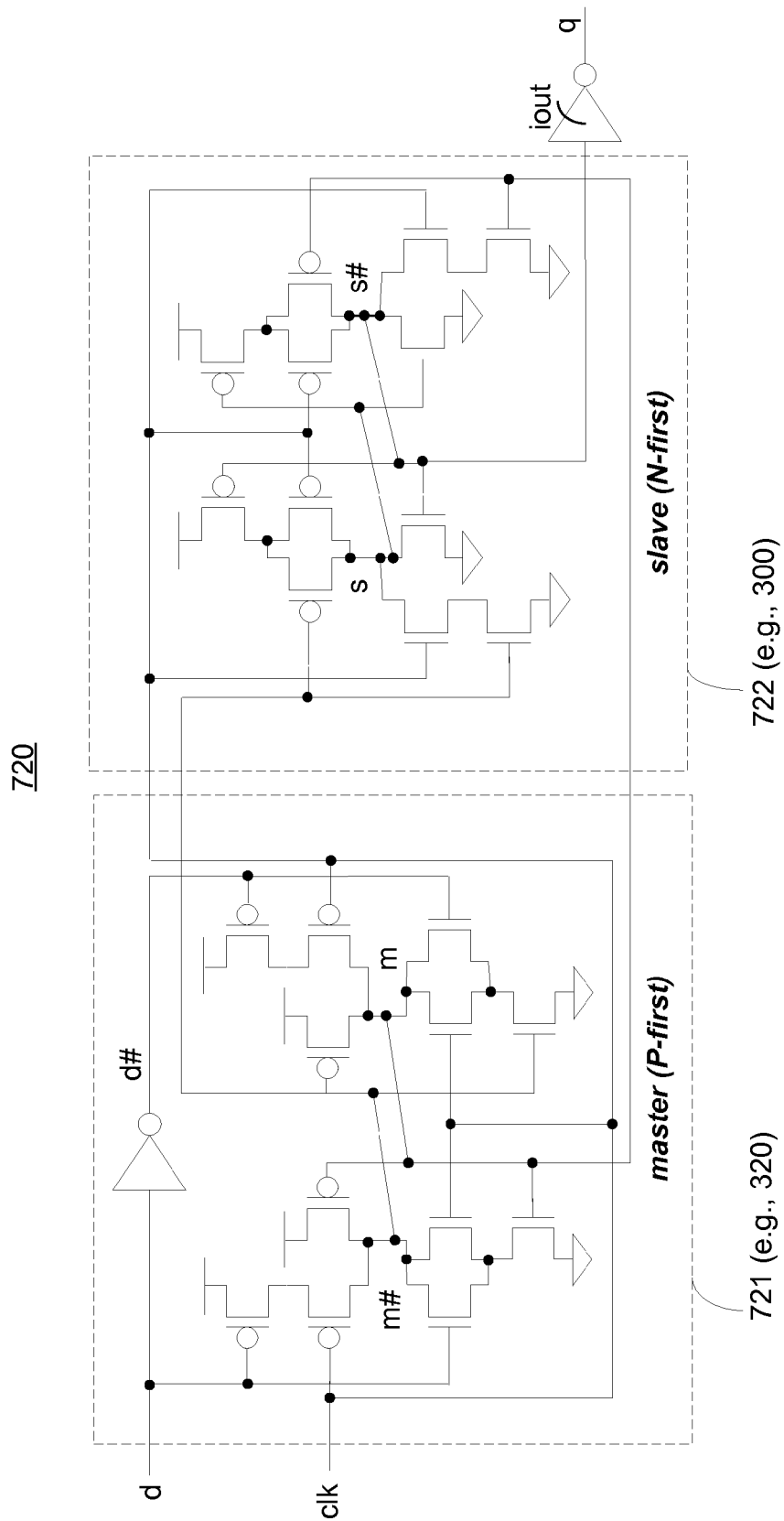
FIG. 7B illustrates circuit level implementation of FIG. 7A, according to one embodiment of the disclosure.

FIG. 7B illustrates circuit level implementation 720 of FIG. 7A, according to one embodiment of the disclosure. It is pointed out that those elements of FIG. 7B having the same reference numbers (or names) as the elements of any other figure can operate or function in any manner similar to that described, but are not limited to such.

In one embodiment, circuit 720 comprises master stage 721, slave stage 722, and output inverter iout to generate output 'q.' In one embodiment, master stage 721 is a P-first AOI latch (e.g., latch 320) while slave stage 722 is an N-first AOI latch (e.g., latch 300).

Figure 8:
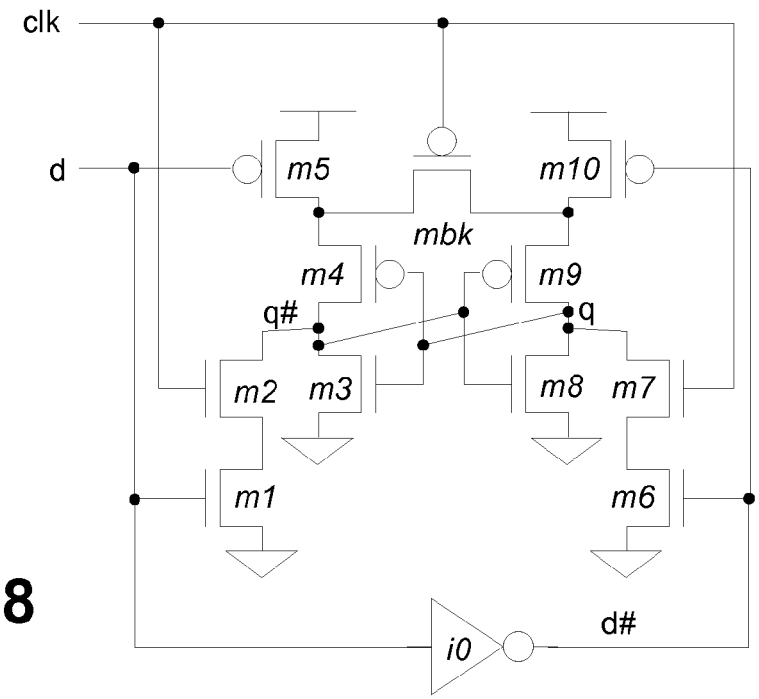
FIG. 8 illustrates an N-first AOI latch with bridge keeper, according to one embodiment of the disclosure.

FIG. 8 illustrates an N-first AOI latch 800 with a bridge keeper, according to one embodiment of the disclosure. It is pointed out that those elements of FIG. 8 having the same reference numbers (or names) as the elements of any other figure can operate or function in any manner similar to that described, but are not limited to such.

So as not to obscure the embodiments of the disclosure, differences between FIG. 8 and FIG. 2B are discussed. In this embodiment, latch 800 has a p-type bridge keeper mbk. In one embodiment, mbk has a gate terminal coupled to "clk," source/drain terminal coupled to drain terminal of m5 (of first AOI gate) and source terminal of m4 (of first AOI gate), and drain/source terminal coupled to drain terminal of m10 (of second AOI gate) and drain terminal of m9 (of second AOI gate). In this embodiment, transistors m11 and m12 of latch 220 are removed and replaced by bridge keeper mbk. In one embodiment, bridge keeper mbk is a single transistor bridging across two cross-coupled AOI logic gates. In this embodiment, the clock transistor count is reduced over latch 120. In one embodiment, the keeper stack increases to 3.

In this embodiment, the keeper stack is formed by p-type devices m4, mbk, and m10. In one embodiment, the keeper stacked is formed by m9, mbk, and m5. In one embodiment when clock is low, mbk is conducting, then either m5 or m10 are turned on since they are controlled by 'd' and "d#" respectively.

Figure 9:
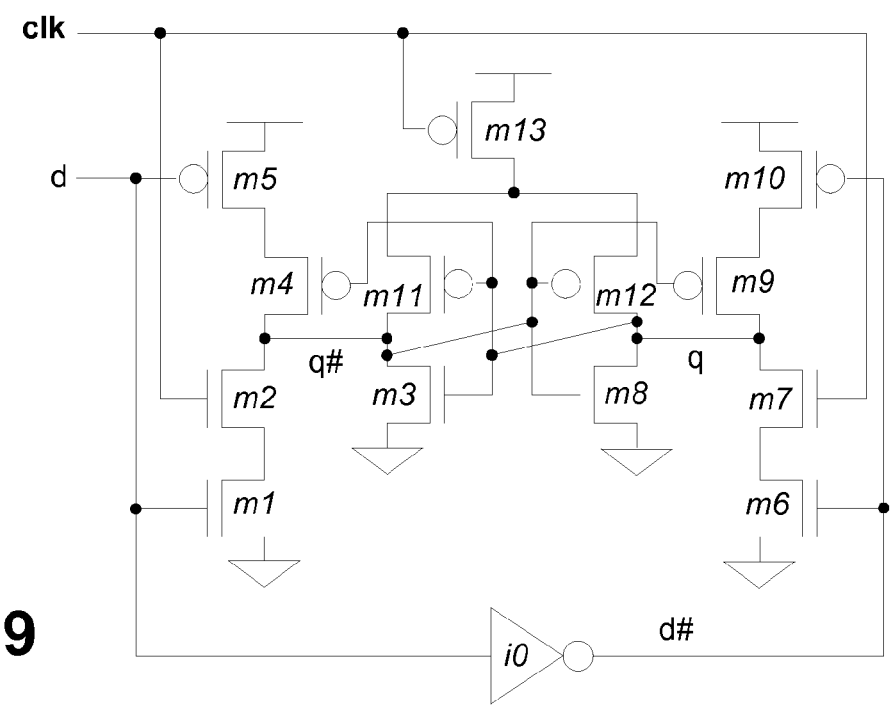
FIG. 9 illustrates an N-first AOI latch with shared keeper, according to one embodiment of the disclosure.

FIG. 9 illustrates an N-first AOI latch 900 with shared keeper, according to one embodiment of the disclosure. It is pointed out that those elements of FIG. 9 having the same reference numbers (or names) as the elements of any other figure can operate or function in any manner similar to that described, but are not limited to such.

So as not to obscure the embodiments of the disclosure, differences between FIG. 9 and FIG. 2B are discussed. In one embodiment, cross-coupled p-type devices m4 and m9 are duplicated with m11 and m12. In this embodiment, m11 and m12 devices of FIG. 2B are re-connected as shown in latch 900. In one embodiment, a single clocked keeper p-type device m13 is shared by the first and second AOI logic gates. In this embodiment, keeper stack of two is maintained. In one embodiment, the keeper stack is formed of m4 and m11. In one embodiment, for N-first AOI latch 900, keeper stack is m11 and m13, or m12 and m13. Embodiments of FIG. 8 and FIG. 9 optimize keeper circuit of AOI latches.

Figure 10:
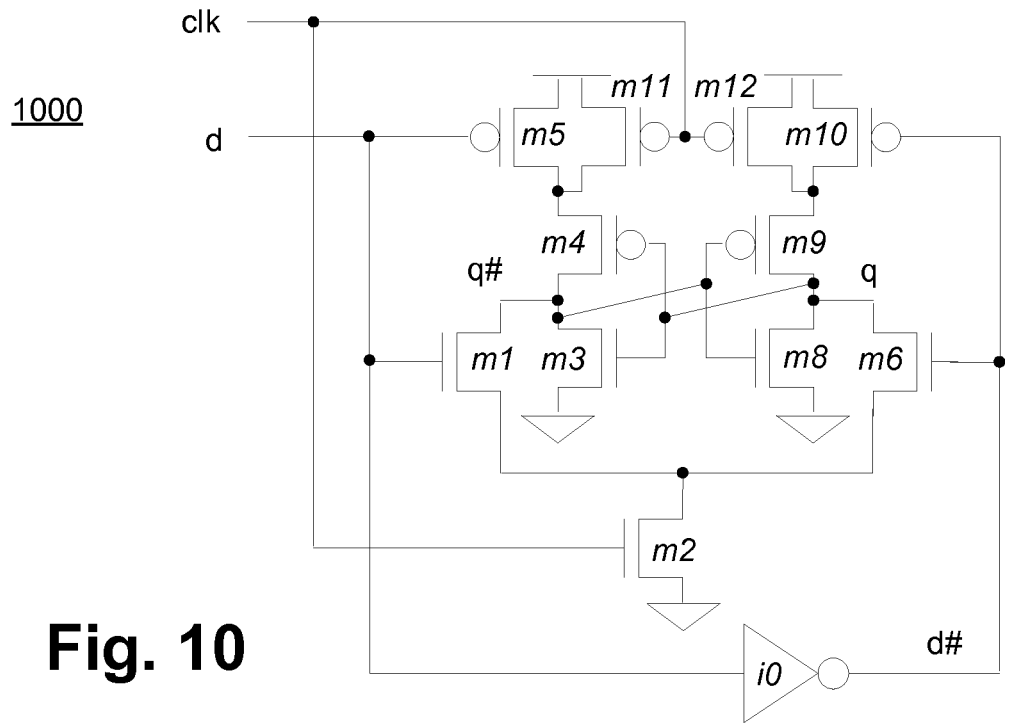
FIG. 10 illustrates an N-first AOI latch with shared clock to optimize data input, according to one embodiment of the disclosure.

FIG. 10 illustrates an N-first AOI latch 1000 with shared clock to optimize data input, according to one embodiment of the disclosure. It is pointed out that those elements of FIG. 10 having the same reference numbers (or names) as the elements of any other figure can operate or function in any manner similar to that described, but are not limited to such.

So as not to obscure the embodiments of the disclosure, differences between FIG. 10 and FIG. 2B are discussed. In one embodiment, data and clock n-type stacks are swapped such that clock transistor m2 (also called shared footer) is shared between the first and second AOI logic gates. For example, data transistor m1 of FIG. 2B is swapped clock transistor m2 of FIG. 2B, and data transistor m6 of FIG. 2B is swapped with clock transistor m7 of FIG. 2B. In such an embodiment, clock transistor count is reduced to three. Compared to embodiment of FIG. 2B, m7 is removed.

Figure 11:
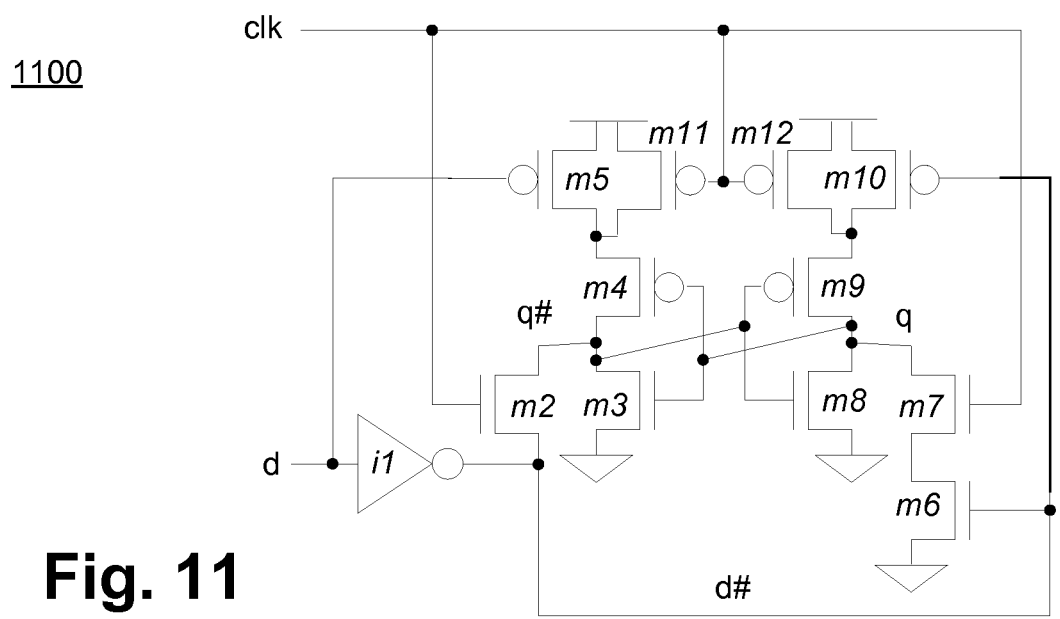
FIG. 11 illustrates an N-first AOI latch with write port to optimize data input, according to one embodiment of the disclosure.

FIG. 11 illustrates an N-first AOI latch 1100 with write port to optimize data input, according to one embodiment of the disclosure. It is pointed out that those elements of FIG. 11 having the same reference numbers (or names) as the elements of any other figure can operate or function in any manner similar to that described, but are not limited to such.

So as not to obscure the embodiments of the disclosure, differences between FIG. 11 and FIG. 2B are discussed. In this embodiment, transistor m1 of FIG. 2B in the data input stage of first AOI stage is removed. In this embodiment, data is driven directly into the clock device m2 diffusion of one of the sides. Here, inverter i1 output couples to the gate of m10, m6, and diffusion regions of m2. In this embodiment, total latch transistor count is reduced to 13 compared to latch 120 of FIG. 2B.

Figure 12:
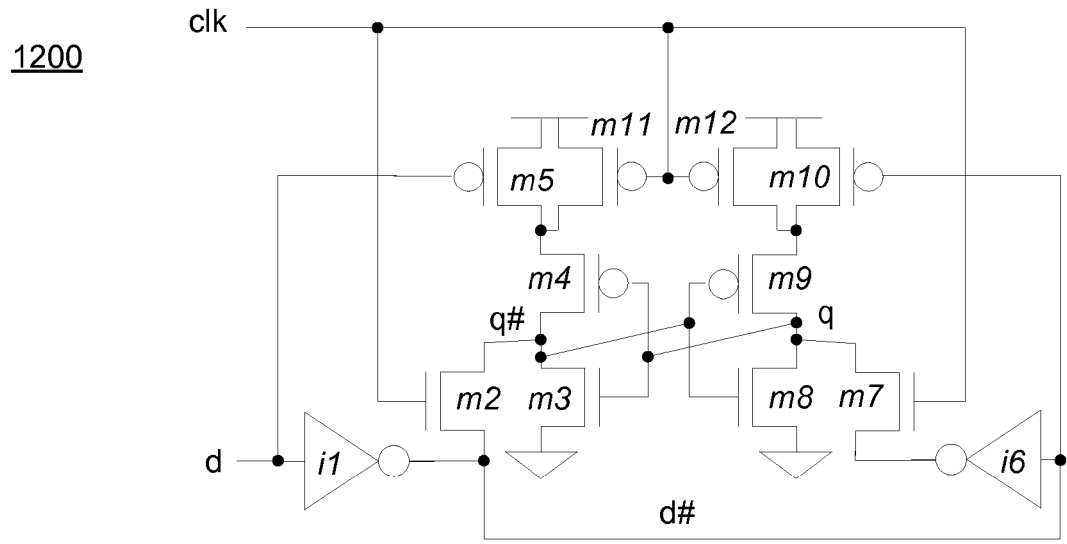
FIG. 12 illustrates a dual-ended N-first AOI latch to optimize data input, according to one embodiment of the disclosure.

FIG. 12 illustrates a dual-ended N-first AOI latch 1200 to optimize data input, according to one embodiment of the disclosure. It is pointed out that those elements of FIG. 12 having the same reference numbers (or names) as the elements of any other figure can operate or function in any manner similar to that described, but are not limited to such.

So as not to obscure the embodiments of the disclosure, differences between FIG. 12 and FIG. 2B are discussed. In this embodiment, m1 and m6 of FIG. 2B are removed. Latch 1200 comprises another inverter i6 having an input coupled to node "d#" and output coupled to source terminal of m7. In this embodiment, data ('d' or "d#") is driven directly into diffusions of clock devices m2 and m7 on both sides. The embodiments of FIGS. 10-12 optimize data input path of the latches.

Figure 13:
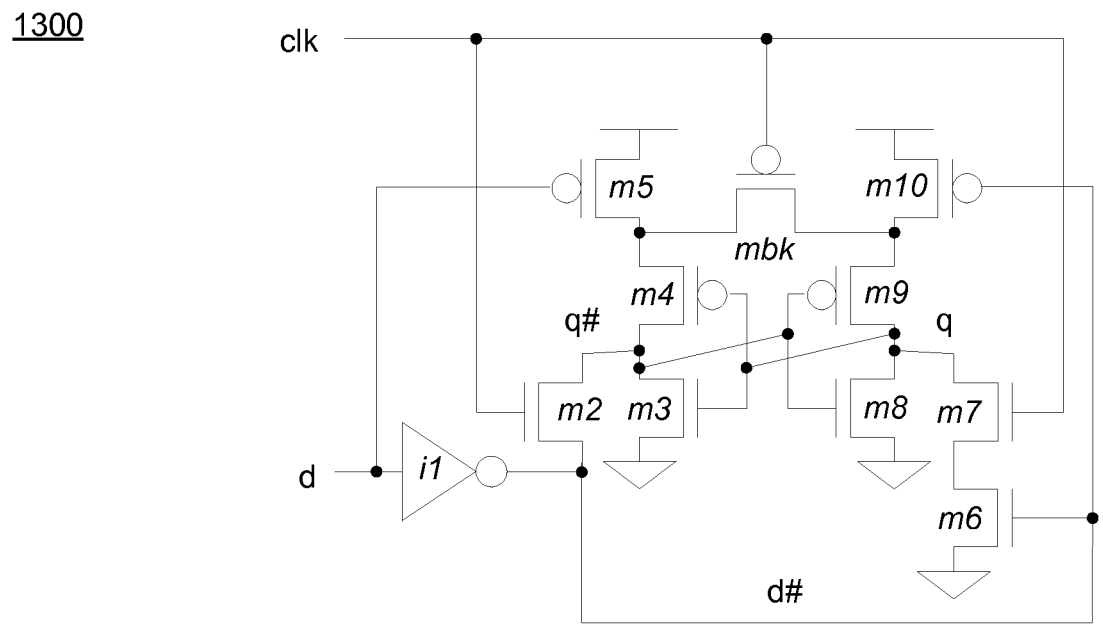
FIG. 13 illustrates an N-first AOI latch with write port and bridge keeper, according to one embodiment of the disclosure.

FIG. 13 illustrates an N-first AOI latch 1300 with write port and bridge keeper, according to one embodiment of the disclosure. It is pointed out that those elements of FIG. 13 having the same reference numbers (or names) as the elements of any other figure can operate or function in any manner similar to that described, but are not limited to such. FIG. 13 is described with reference to FIG. 8 and FIG. 11. In this embodiment, latch 800 is modified to include write port AOI logic gate of latch 1100. For example, transistor m1 of latch 800 is removed and data (i.e., "d#") is directly driven to diffusion of m2.

Various embodiments can be combined with other embodiments. For example, embodiment of latch 800 can also be combined with any of the data path optimized latches of FIGS. 10-12. While the embodiments of FIGS. 8-13 are illustrated as N-first AOI latches, the concepts discussed in FIGS. 8-13 can also be implemented in P-first OAI latches. The embodiments discussed here can also be used as scan-chains. In such embodiments, a scan multiplexer (not shown) is added at the input of the data path. In one embodiment, adding a scan multiplexer at the input may add inversion to the data path. In such an embodiment, the master or slave stage is made inverting making the whole flip-flop with scan non-inverting. In one such embodiment, the scan multiplexer is controllable by a scan enable signal, the scan multiplexer inputs are scan data and regular data, and scan multiplexer output is coupled to data node 'd.'

Figure 14:
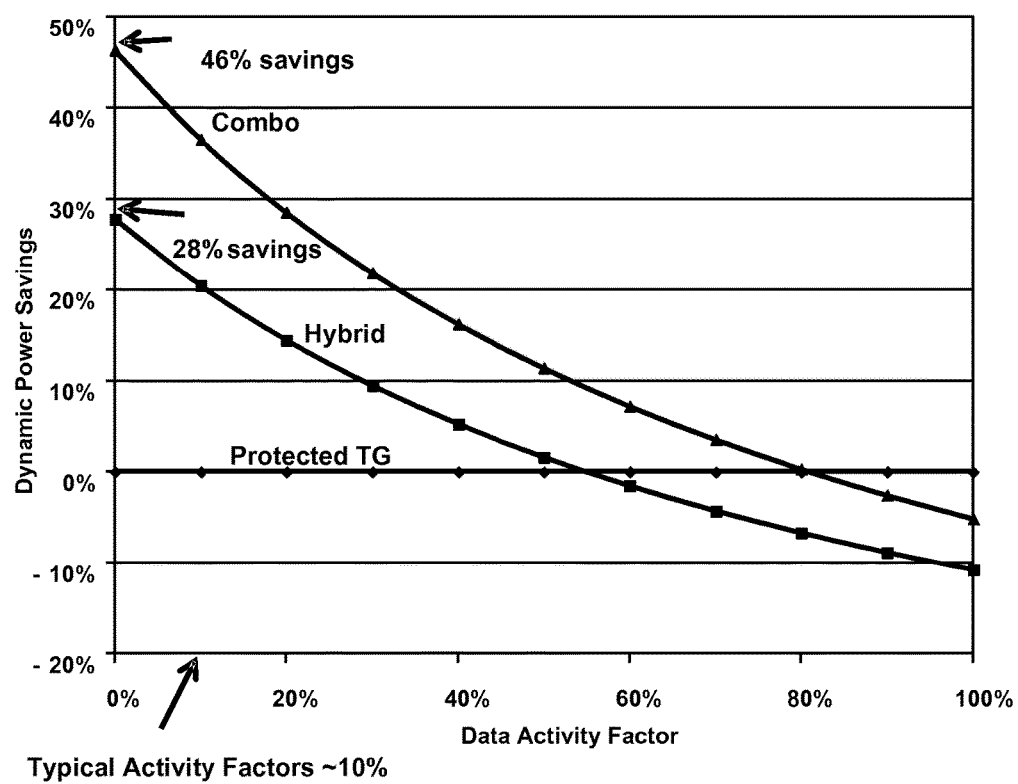
FIG. 14 illustrates a plot showing power savings vs. data activity factor for a conventional transmission-gate based FF, hybrid N-first AOI based rising edge FF, and combo N-first AOI and P-first OAI based rising edge FF, according to one embodiment of the disclosure.

FIG. 14 illustrates a plot 1400 showing power savings vs. data activity factor for a conventional transmission-gate based FF, hybrid N-first AOI based rising edge FF, and combo N-first AOI and P-first OAI based rising edge FF, according to one embodiment of the disclosure. It is pointed out that those elements of FIG. 14 having the same reference numbers (or names) as the elements of any other figure can operate or function in any manner similar to that described, but are not limited to such.

Here, x-axis is data activity factor in percentage, and y-axis is dynamic power savings in percentage relative to a traditional protected input TG flip-flop. Typical data activity factor for data path is about 10%. This translates into one data transitions for every ten clock cycles. The dynamic power savings for hybrid N-first AOI based FF (of FIGS. 6A-B) is compared with reference to conventional protected TG based FF (of FIG. 1B). The dynamic power savings for combo N-first AOI and P-first OAI based FF (of FIGS. 7A-B) is compared with reference to conventional protected TG based FF (of FIG. 1B).

Table 1 compares normalized timing parameters (e.g., setup, clk-to-q (clk2q) delay, and hold) for three FF topologies—conventional protected TG, hybrid N-first AOI, and combo N-first AOI and P-first OAI with two input scan multiplexer at the input of the data path.

TABLE 1

Timing Parameters for various topologies with respect to protected TG

| Flip-flop | Rise-to-Rise (FO4) | | | | Fall-to-Fall (FO4) | | | |
|---|---|---|---|---|---|---|---|---|
| w/mux–D | setup | clk-q | hold | D-Q | setup | clk-q | hold | D-Q |
| Protected TG | 1.6 | 2.8 | −0.3 | 4.4 | 2.3 | 2.2 | 0.1 | 4.5 |
| Hybrid AOI | 2.6 | 2.7 | −1.2 | 5.3 | 3.6 | 2.3 | −1.7 | 5.9 |
| Combo AOI | 3.3 | 2.3 | −2.8 | 5.6 | 3.7 | 3.3 | −1.4 | 7.0 |

Plot 1400 shows when activity factor is zero, hybrid N-first AOI provides 28% savings over the conventional protected TG based FF, and combo N-first AOI and P-first OAI based FF provides 46% savings over the conventional protected TG based FF. Plot 1400 also shows when activity factor is 10%, hybrid N-first AOI provides 20% savings over the conventional protected TG based FF, and combo N-first AOI and P-first OAI based FF provides 37% savings over the conventional protected TG based FF. This power reduction includes the local clock buffer power driving the "clk" node for each FF, as well.

Figure 15:
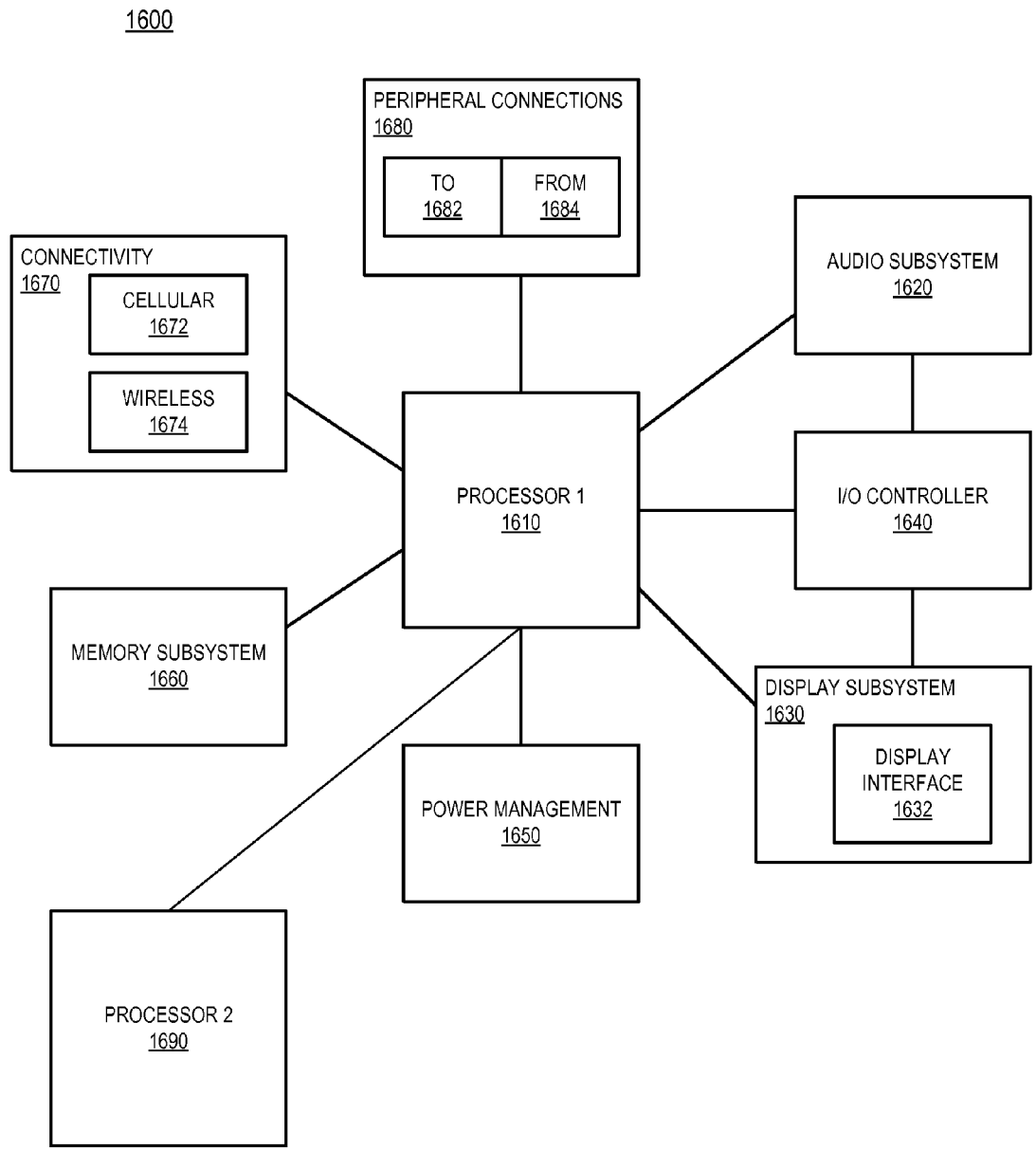
FIG. 15 is a smart device or a computer system or an SoC (system-on-chip) with N-first AOI and/or P-first OAI latches and/or FFs, according to one embodiment of the disclosure.

FIG. 15 is a smart device or a computer system or an SoC (system-on-chip) 1600 with N-first AOI and/or P-first OAI latches and/or FFs, according to one embodiment of the disclosure. It is pointed out that those elements of FIG. 15 having the same reference numbers (or names) as the elements of any other figure can operate or function in any manner similar to that described, but are not limited to such.

FIG. 15 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with N-first AOI and/or P-first OAI latches and/or FFs, according to the embodiments discussed.

Other blocks of the computing device 1600 may also include a N-first AOI and/or P-first OAI latches and/or FFs according to the embodiments discussed. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, a latch is provided which comprises: a first AND-OR-invert (AOI) logic gate; and a second AOI logic gate coupled to the first AOI logic gate, wherein the first and second AOI logic gates have respective first and second keeper devices coupled to a power supply node. In one embodiment, the first AOI logic gate comprises: first and second n-type devices coupled in series; a third n-type device coupled to the second n-type device at a storage node; and first and second p-type devices coupled in parallel, the first and second p-type devices coupled to the storage node and the first keeper device. In one embodiment, the first n-type device and the first p-type device have their respective gate terminals coupled to a data node. In one embodiment, the second n-type device and the second p-type device have their respective gate terminals coupled to a clock node. In one embodiment, the second n-type device and the first p-type device have their respective gate terminals coupled to a data node. In one embodiment, the first n-type device and the second p-type device have their respective gate terminals coupled to a clock node.

In one embodiment, the second AOI logic gate comprises: first and second n-type devices coupled in series; a third n-type device coupled to the second n-type device at a storage node; and first and second p-type devices coupled in parallel, the first and second p-type devices coupled to the storage node and the second keeper device. In one embodiment, a gate terminal of the first keeper device is coupled to a gate terminal of the third n-type device of the first AOI logic gate and the storage node of the second AOI logic gate. In one embodiment, a gate terminal of the second keeper device is coupled to a gate terminal of the third n-type device of the second AOI logic gate and the storage node of the first AOI logic gate. In one embodiment, the first n-type device and the first p-type device of the second AOI logic gate have their respective gate terminals coupled to an output of an inverter.

In one embodiment, the second n-type device and the second p-type device of the second AOI logic gate have their respective gate terminals coupled to a clock node. In one embodiment, the second n-type device and the first p-type device of the second AOI logic gate have their respective gate terminals coupled to an output of an inverter. In one embodiment, the first n-type device and the second p-type device of the second AOI logic gate have their respective gate terminals coupled to a clock node. In one embodiment, the latch further comprises an inverter with an input node coupled to either the storage node of the first AOI logic gate or the storage node of the second AOI logic gate.

In another example, a flip-flop is provided which comprises: a first latch including: a first AND-OR-invert (AOI) logic gate; and a second AOI logic gate coupled to the first AOI logic gate, wherein the first and second AOI logic gates have respective first and second keeper devices coupled to a power supply, the first latch having an output node; and a second latch having an input node coupled to the output node of the first latch, the second latch having an output node to provide an output of the flip-flop.

In one embodiment, the second latch comprises: a first AOI logic gate; and a second AOI logic gate coupled to the first AOI logic gate, wherein the first and second AOI logic gates have respective first and second keeper devices coupled to the power supply. In one embodiment, the first AOI logic gate comprises: first and second n-type devices coupled in series; a third n-type device coupled to the second n-type device at a storage node; and first and second p-type devices coupled in parallel, the first and second p-type devices coupled to the storage node and the first keeper device.

In another example, a system is provided which comprises: a memory unit; a processor coupled to the memory unit, the processor having a latch which includes: a first AND-OR-invert (AOI) logic gate; and a second AOI logic gate coupled to the first AOI logic gate, wherein the first and second AOI logic gates have respective first and second keeper devices coupled to a power supply; and a wireless interface for allowing the processor to couple to another device. In one embodiment, the system further comprises a display unit. In one embodiment, the first AOI logic gate comprises: first and second n-type devices coupled in series; a third n-type device coupled to the second n-type device at a storage node; and first and second p-type devices coupled in parallel, the first and second p-type devices coupled to the storage node and the first keeper device.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
   a first AND-OR-invert (AOI) logic gate; and,
   a second AOI logic gate coupled to the first AOI logic gate, wherein the first and second AOI logic gates comprise respective first and second keeper devices coupled to a power supply node;
   a clock input signal line coupled to both the first and second AOI logic gates;
   a data input signal line coupled to the first AOI logic gate and an inverted data input signal line coupled to the second AOI logic gate, wherein the inverted data input signal line is coupled to a first transistor of the second AOI gate that resides between the second keeper device and a second transistor of the second AOI gate that is also coupled to the inverted data input signal line.

2. The apparatus of claim 1 wherein the data input signal line is coupled to a first transistor of the first AOI gate that resides between the first keeper device and a second transistor of the first AOI gate that is also coupled to the data input signal line.

3. The apparatus of claim 2 wherein the first transistor of the AOI gate, the second transistor of the first AOI gate and a third transistor of the first AOI gate are coupled to an internal node of the first AOI gate.

4. The apparatus of claim 3 wherein the internal node is coupled to the first keeper device.

5. The apparatus of claim 3 wherein the internal node is coupled to the second keeper device.

6. The apparatus of claim 3 wherein the internal node is coupled to a gate node of the second keeper device and is coupled to a gate node of a third transistor that is a component of the second AOI logic gate, the third transistor coupled to the second transistor of the second AOI gate.

7. A computing system, comprising:
   a processor;
   a memory subsystem; a display;
   circuitry comprising a) and b) below:
   a) a first AND-OR-invert (AOI) logic gate; and,
   b) a second AOI logic gate coupled to the first AOI logic gate, wherein the first and second AOI logic gates comprise respective first and second keeper devices coupled to a power supply node;

a data input signal line coupled to the first AOI logic gate and an inverted data input signal line coupled to the second AOI gate, wherein the data input signal line is coupled to a first transistor of the first AOI gate that resides between the first keeper device and a second transistor of the first AOI gate that is also coupled to the data input signal line.

8. The computing system of claim 7 further comprising a clock input signal line coupled to both the first and second AOI logic gates.

9. The computing system of claim 7 wherein the inverted data input signal is coupled to a first transistor of the second AOI gate that resides between the second keeper device and a second transistor of the second AOI gate that is also coupled to the second data input signal.

10. The computing system of claim 7 wherein the first transistor of the AOI gate, the second transistor of the first AOI gate and a third transistor of the first AOI gate are coupled to an internal node of the first AOI gate.

11. The computing system of claim 10 wherein the internal node is coupled to the first keeper device.

12. The computing system of claim 10 wherein the internal node is coupled to the second keeper device.

13. The computing system of claim 10 wherein the internal node is coupled to a gate node of the second keeper device and is coupled to a gate node of a third transistor that is a component of the second AOI logic gate, the third transistor coupled to the second transistor of the second AOI gate.

* * * * *